(12) United States Patent
Okada (10) Patent No.: US 7,672,654 B2
(45) Date of Patent: Mar. 2, 2010

(54) BROADCASTING RECEIVER AND METHOD OF RECEIVING A BROADCASTING WAVE

(75) Inventor: Kunio Okada, Iruma (JP)

(73) Assignee: Casio Computer Co., Ltd., Tokyo (JP)

( * ) Notice: Subject to any disclaimer, the term of this patent is extended or adjusted under 35 U.S.C. 154(b) by 931 days.

(21) Appl. No.: 11/453,211

(22) Filed: Jun. 14, 2006

(65) Prior Publication Data

US 2007/0010193 A1  Jan. 11, 2007

(30) Foreign Application Priority Data

Jul. 8, 2005 (JP) ............................. 2005-199604
Jul. 8, 2005 (JP) ............................. 2005-199605

(51) Int. Cl.
*H04B 1/06* (2006.01)

(52) U.S. Cl. ................. 455/232.1; 455/245.1

(58) Field of Classification Search ............. 455/232.1, 455/234.1, 245.1, 250.1; 348/726, 729
See application file for complete search history.

(56) References Cited

U.S. PATENT DOCUMENTS 4,939,789 A * 7/1990 Sakashita et al. ............ 455/260
4,994,756 A * 2/1991 Brilka ......................... 330/260
5,535,443 A * 7/1996 Wignot ..................... 455/196.1
6,101,312 A * 8/2000 Funayama .................... 386/93

FOREIGN PATENT DOCUMENTS

JP        2004-229170 A        8/2004

* cited by examiner

*Primary Examiner*—Quochien B Vuong
(74) *Attorney, Agent, or Firm*—Frishauf, Holtz, Goodman & Chick, P.C.

(57) ABSTRACT

A receiver has an amplifier for amplifying a TV broadcast signal. A mixer mixes the amplified signal with an oscillation signal corresponding to a channel selection signal and generates a low frequency signal. A bandpass filter generates a signal having an amplitude corresponding to the low frequency signal. Electric field intensity filtering circuits filter the low frequency signal. A subtractor calculates a difference between the output from the filtering circuits and the output from the bandpass filter to generate a difference signal which is negatively fed back signal to the amplifier when an amplitude of the difference signal is larger than a predetermined value. The signal from the filtering circuit is the negative feed back signal when the amplitude of the difference signal is not larger than the predetermined value. An AGC signal corresponding to an electric field intensity of the output from the mixer is inputted to the amplifier.

11 Claims, 8 Drawing Sheets

| HIGH FREQUENCY SIGNAL (b) | DIGITAL DATA (LIMIT DATA) |
|---|---|
| NOT LARGER THAN P1 dB | H |
| LARGER THAN OR EQUAL TO P1 dB | L |

| SELECTION SIGNAL i | OPERATION OF SW 8 |
|---|---|
| H | SELECT RSSI FILTER 6 |
| L | SELECT RSSI FILTER 7 |

BROADCASTING RECEIVER AND METHOD OF RECEIVING A BROADCASTING WAVE

CROSS-REFERENCE TO RELATED APPLICATIONS

This application is based on and claims the benefit of priority from the prior Japanese Patent Application Nos. 2005-199604 and 2005-199605, filed Mar. 28, 2005, the entire contents of which are incorporated herein by reference.

BACKGROUND OF THE INVENTION

1. Field of the Invention

The present invention relates to a broadcasting receiver and a method of receiving a broadcasting wave, and more particularly, to a broadcasting receiver and a method of receiving a broadcasting wave, which controls an amplitude of a received signal.

2. Description of the Related Art

Broadcasting services using broadcast satellites and communication satellites are now provided, and in addition to these services, digitalized terrestrial broadcast is scheduled to start its service.

Figure 8:
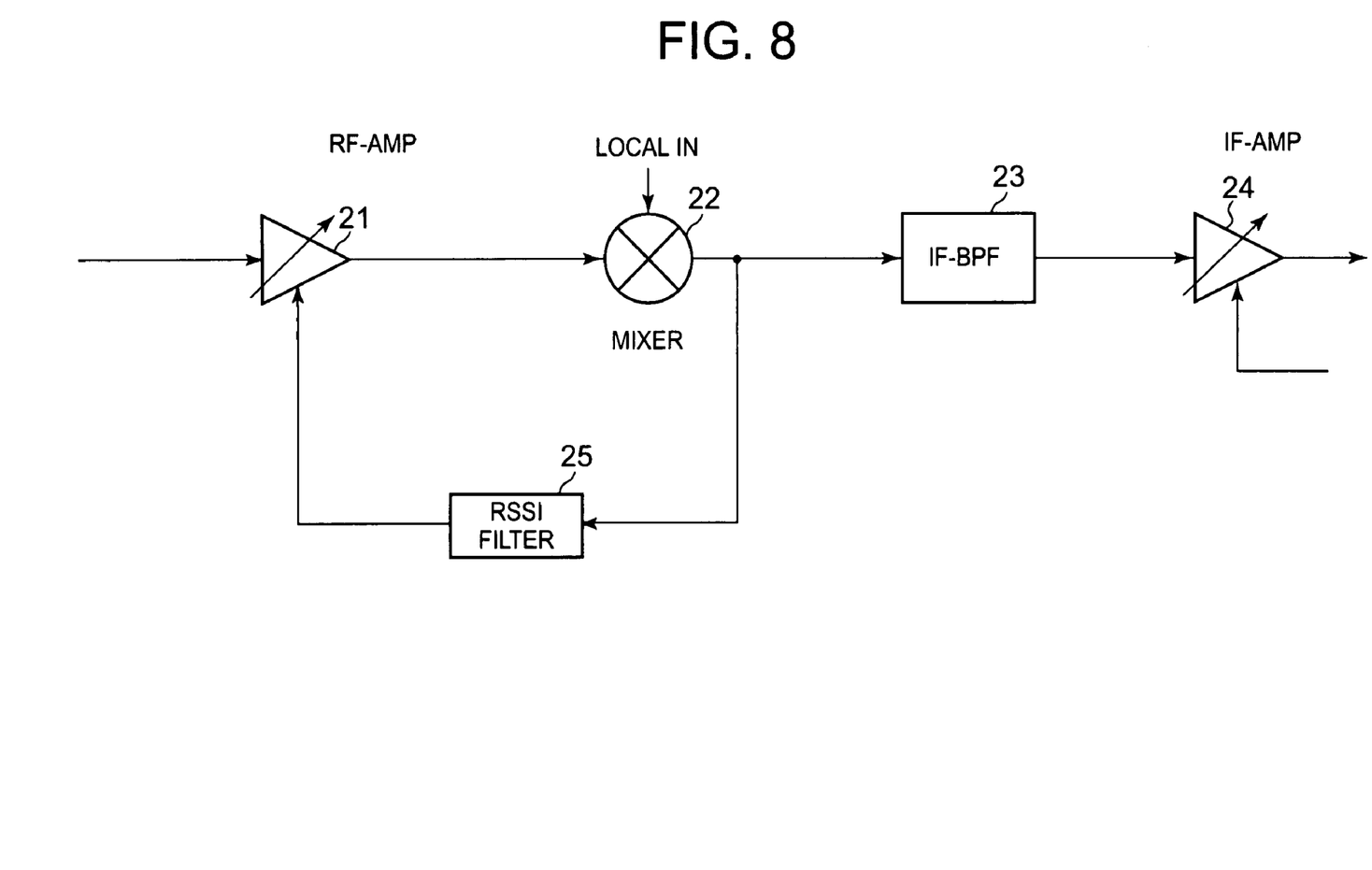
FIG. 8 is a block diagram of a configuration of a conventional TV receiver.
Figure 9:
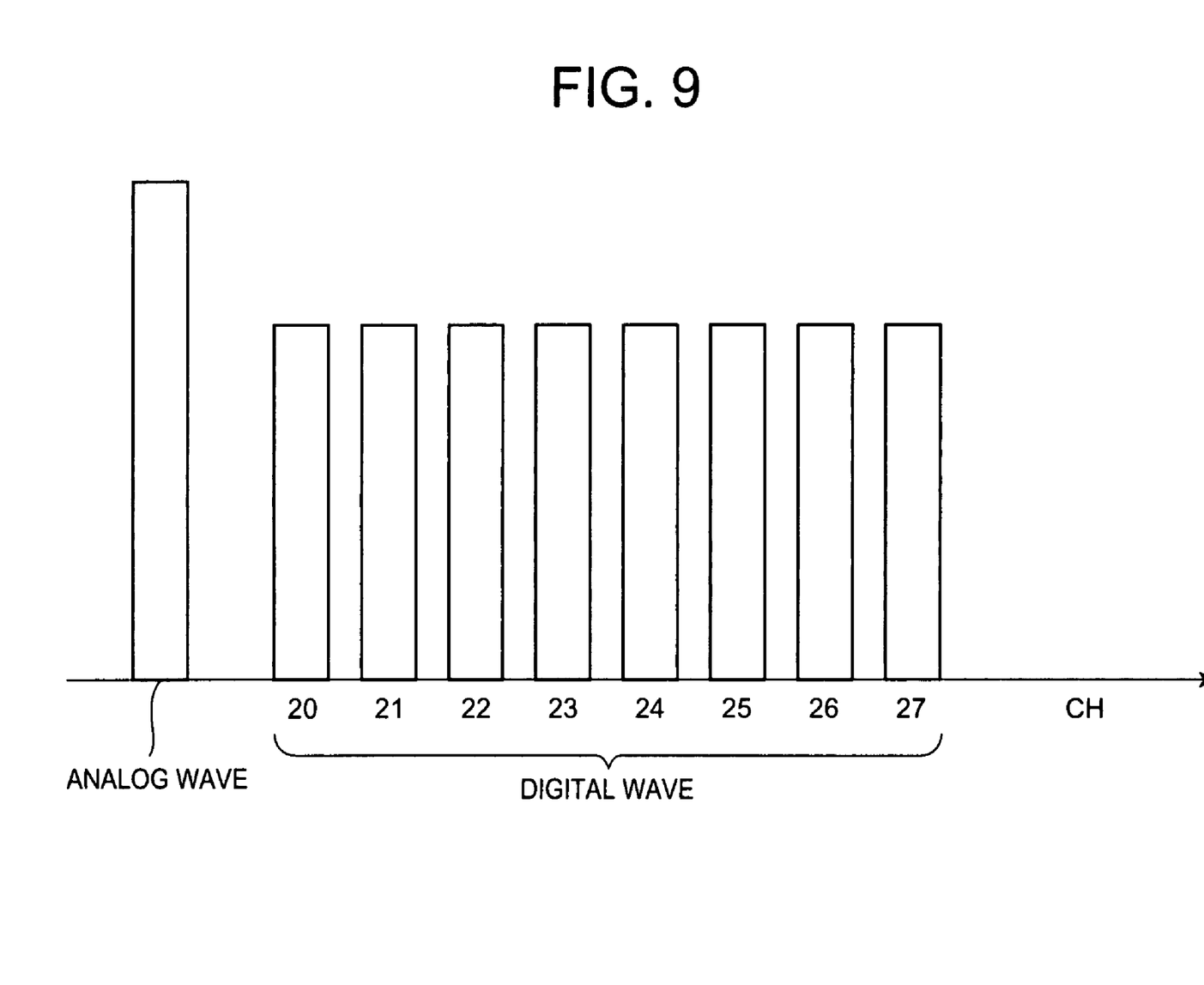
FIG. 9 is a view illustrating an electric wave distribution of analog waves and digital waves over Kanto area (a local area in Japan).

FIG. 8 is a view showing a receiving circuit in a conventional digital TV receiver. FIG. 9 is a view illustrating an electric wave distribution of analog waves (16 channels) and digital waves (8 channels, Channel Nos. 20 to 27) in Kanto area (a local area in Japan).

In FIG. 8, RF-AMP (radio-frequency signal amplifying circuit) 21 receives and amplifies a radio-frequency signal from an antenna, and outputs the amplified radio-frequency signal to MIXER (mixer circuit) 22. MIXER 22 mixes the radio-frequency signal received from RF-AMP 21 with a local oscillation signal supplied from a local oscillation circuit (not shown) to generate a low frequency signal. IF-BPF (low frequency band pass filter circuit) 23 receives and filters the low frequency to allow a signal falling within a predetermined frequency band to pass through. IF-AMP (low frequency signal amplifying circuit) 24 receives and amplifies the low frequency signal from IF-BPF 23. Gain of IF-AMP 24 is controlled by a feed back signal supplied from a demodulation circuit (not shown). RSSI•Filter (electric field intensity filter circuit) 25 generates a feed back signal corresponding to the low frequency signal received from MIXER 22 and supplies the feed back signal to RF-AMP 21 to control its gain.

In the receiving circuit shown in FIG. 8, since RF-AMP 21 receives analog waves in addition to plural digital waves, RF-AMP 21 is supplied with the feed back signal generated by RSSI•Filter 25 based on the electric field intensities of all the received waves. When some digital broadcasting channel is received at an area covered by a frequency band covering 8 channels of digital waves (channel 20 to channel 17) as shown in FIG. 9, an interference can be caused by adjacent channel waves, since the adjacent channel digital waves and/or analog waves are received in addition to the tuned in broadcasting channel wave. In other words, even though the user's tuned in channel wave is received, other adjacent channel waves are received to interfere with a receiving operation of the broadcasting wave in the broadcasting receiver.

To overcome the adjacent channel interference, there has been proposed a broadcasting receiver and a method of receiving a broadcasting wave in Japanese Laid-open Patent Application No. 2004-229170 (Patent Document #1). The broadcasting receiver is provided with a subsidiary tuner in addition to a main tuner to effectively attenuate a signal level of inter-modulation interference and to suppress drop in the received signal level of the tuned in broadcasting wave. While the main tuner receives the broadcasting wave and the wave is demodulated, the subsidiary tuner detects a state of the broadcasting wave, and controls the receiving operation of the main tuner based on the detection result. More specifically, the subsidiary tuner detects two inter-modulation interference broadcasting stations with respect to the tuned in broadcasting station, and when a difference between either of frequencies of the two inter-modulation interference broadcasting stations, which is closer to the frequency of the tuned in broadcasting station, and the frequency of the tuned in broadcasting station is not larger than a first previously set value, a tuning frequency control unit makes a tuning frequency of a tuning circuit more apart from the interference frequency. When such difference is larger than or equal to a second set value which is larger than the first set value, the tuning frequency control unit makes the tuning frequency of the tuning circuit closer to the interference frequency.

However, the broadcasting receiver provided with two tuners (main tuner and subsidiary tuner) as disclosed in the Patent Document #1, invites such disadvantages that manufacturing costs increase, power consumption raises, and the receiver is hard to make compact in size and light in weight. The digital terrestrial broadcasting will provide service for mobile communication terminals such as cellular phones, too. Therefore, the above disadvantages of the broadcasting receiver need to be solved. That is, the disadvantages that increase power consumption and make it hard to manufacture compact in size and light in weight are the problem to be solved first for enjoying services brought by the digital terrestrial broadcasting. It is not preferable to bring in the above disadvantages in order to solve frequency jamming problems.

The present invention has been made to solve these problems involved the conventional broadcasting receivers, and has an object to provide a broadcasting receiver which is made compact in size and light in weight, and further is capable of effectively reducing signal levels of the interference broadcasting stations and preventing drop in a signal level of a broadcasting wave to be intended to receive without increasing power consumption and manufacturing costs, and also to provide a method of receiving a broadcasting wave, used in such broadcasting receiver.

SUMMARY OF THE INVENTION

According to one aspect of the invention, there is provided a broadcasting receiver which comprises a receiving unit for receiving a broadcasting radio-frequency signal, an amplifying unit having a feed back terminal, for amplifying the radio-frequency signal received by the receiving unit at a gain corresponding to a feed back signal entered to the feed back terminal, a mixing unit for mixing the radio-frequency signal amplified by the amplifying unit with a variable oscillation signal corresponding to a channel selection signal for selecting a frequency band to be received whereby the mixing unit generates a low frequency signal, and a signal generating unit for generating a first signal having an amplitude corresponding to the low frequency signal generated by the mixing unit. The receiver further comprises a signal processing unit for executing a filtering process on the low frequency signal generated by the mixing unit to allow only signal components of the low frequency signal which fall within a filtering frequency band to pass through, the filtering frequency band being determined by a relationship between a frequency band to which the low frequency signal belongs and a frequency band assigned to a broadcast receiving area where the broadcasting receiver receives the broadcasting radio-frequency signal, a subtracting unit for calculate a difference between the first signal generated by the signal generating unit and the signal subjected to the filtering process by the signal processing unit, and for generating a second signal corresponding to the calculated difference, and a first signal selection unit for feeding back the second signal as a negative feed back signal to the feed back terminal of the amplifying unit, when an amplitude of the second signal is larger than a predetermined value, and feeding back the first signal as a negative feed back signal to the feed back terminal of the amplifying unit, when the amplitude of the second signal is not larger than the predetermined value.

Further, the broadcasting receiver of the invention comprises a feed back unit for generating a negative feed back signal having an amplitude corresponding to the low frequency signal generated by the mixing unit, and for supplying the negative feed back signal to the feed back terminal of the amplifying unit, and a control unit for holding an amplitude of the feed back signal generated just before an amplitude of the radio-frequency signal amplified by the amplifying unit exceeds a predetermined value, when the amplitude of the radio-frequency signal exceeds the predetermined value, and for controlling feed back unit to supply the feed back signal having the held amplitude to the feed back terminal of the amplifying unit.

DETAILED DESCRIPTION OF THE PREFERRED EMBODIMENT OF THE INVENTION

Now, an embodiments of a broadcasting receiver according to the present invention will be described with reference to FIGS. 1 to 7.

Figure 1:
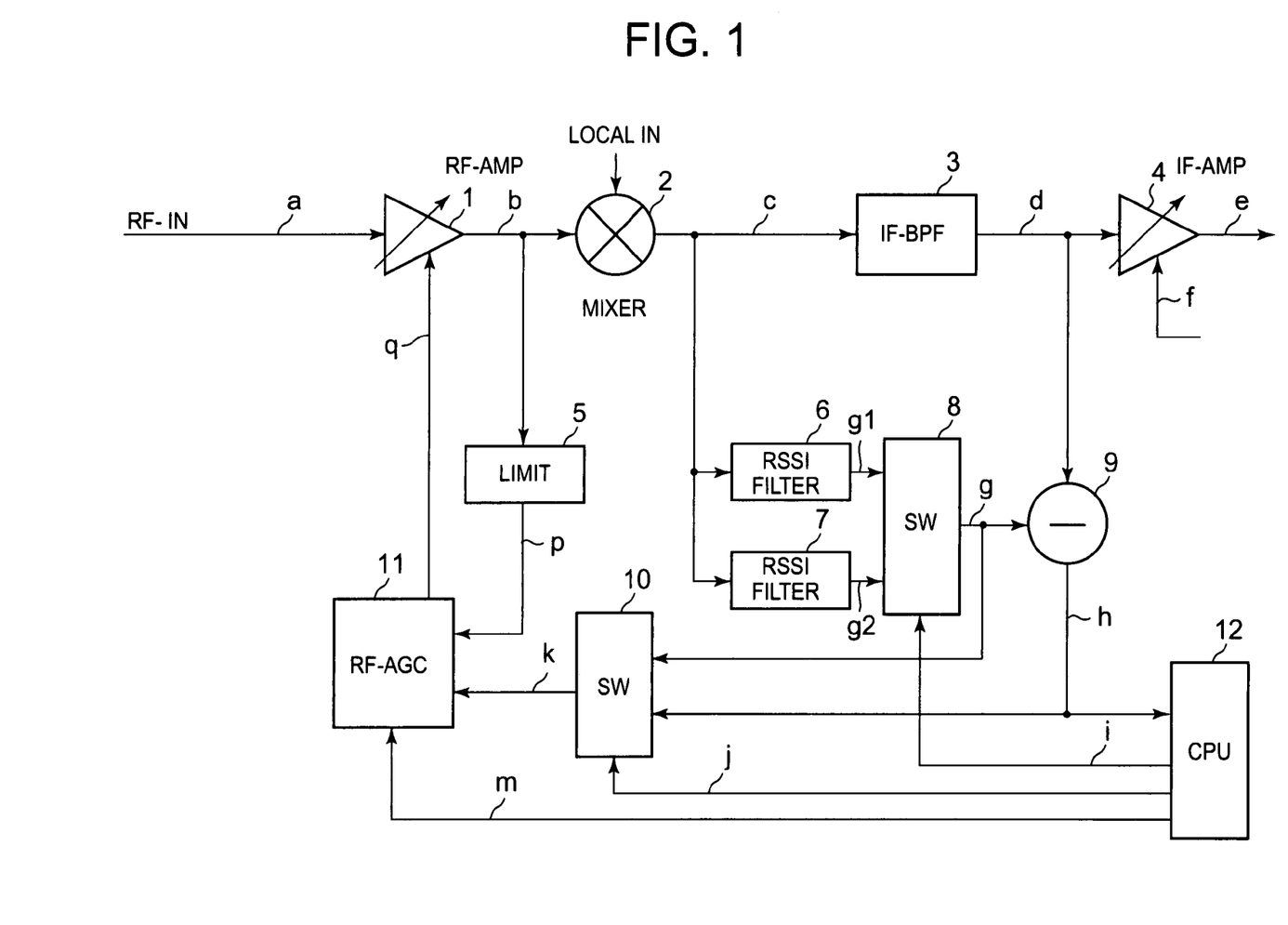
FIG. 1 is a block diagram showing a configuration of a broadcasting receiver according to the present invention.

FIG. 1 is a schematic block diagram of a configuration of a part of the broadcasting receiver according to the embodiment of the invention. As shown in FIG. 1, the broadcast receiver comprises RF-AMP (radio-frequency signal amplifying circuit) 1, MIXER (mixer circuit) 2, IF-BPF (low frequency band pass filter) 3, IF-AMP (low frequency signal amplifying circuit) 4, LIMIT (limiter circuit) 5, RSSI•Filter (electric field intensity filter circuit) 6, RSSI•Filter (electric field intensity filter circuit) 7, SW (switching circuit) 8, subtractor 9, SW (switching circuit) 10, RF-AGC (automatic gain control circuit) 11, CPU 12 and demodulation circuit (not shown)

RF-AMP 1 receives and amplifies a radio-frequency signal (a) from an antenna (not shown) and supplies the amplified radio-frequency signal, i.e. high frequency signal (b) to MIXER 2. MIXER 2 mixes the high frequency signal (b) with a variable oscillation signal supplied from a local oscillator (not shown) to generate and supply a low frequency signal (c) to IF-BPF 3. IF-BPF 3 subjects the low frequency signal (c) to a band pass filtering process to allow signal components to pass through, which signal components fall within a range of a low frequency band of a digital terrestrial broadcasting wave, and supplies to IF-AMP 4 the low frequency signal (d) subjected to the band pass filtering process. IF-AMP 4 amplifies the received low frequency signal (d) and supplies the amplified low frequency signal (e) to the demodulation circuit and simultaneously controls its output level in response to a feed back signal (f) supplied from the demodulation circuit.

Figure 2A:
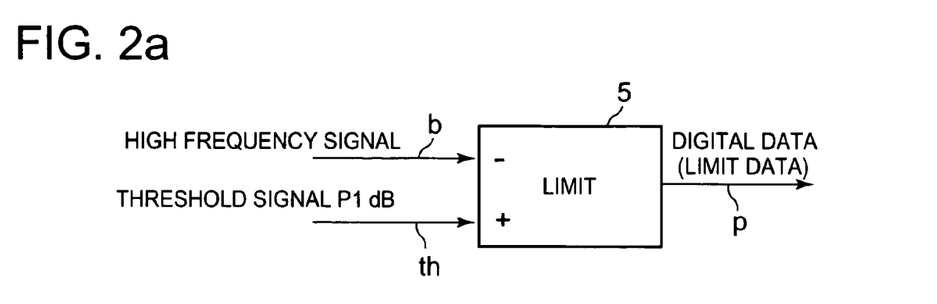
FIGS. 2a, 2b and 2c are views showing an input and/or output operation of a limiter circuit shown in FIG. 1.
Figure 2B:
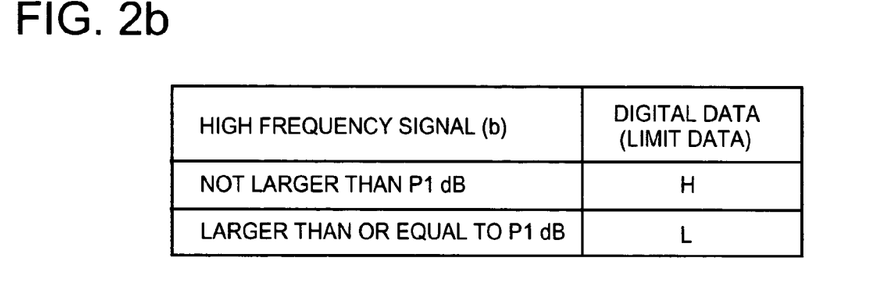
Figure 2C:
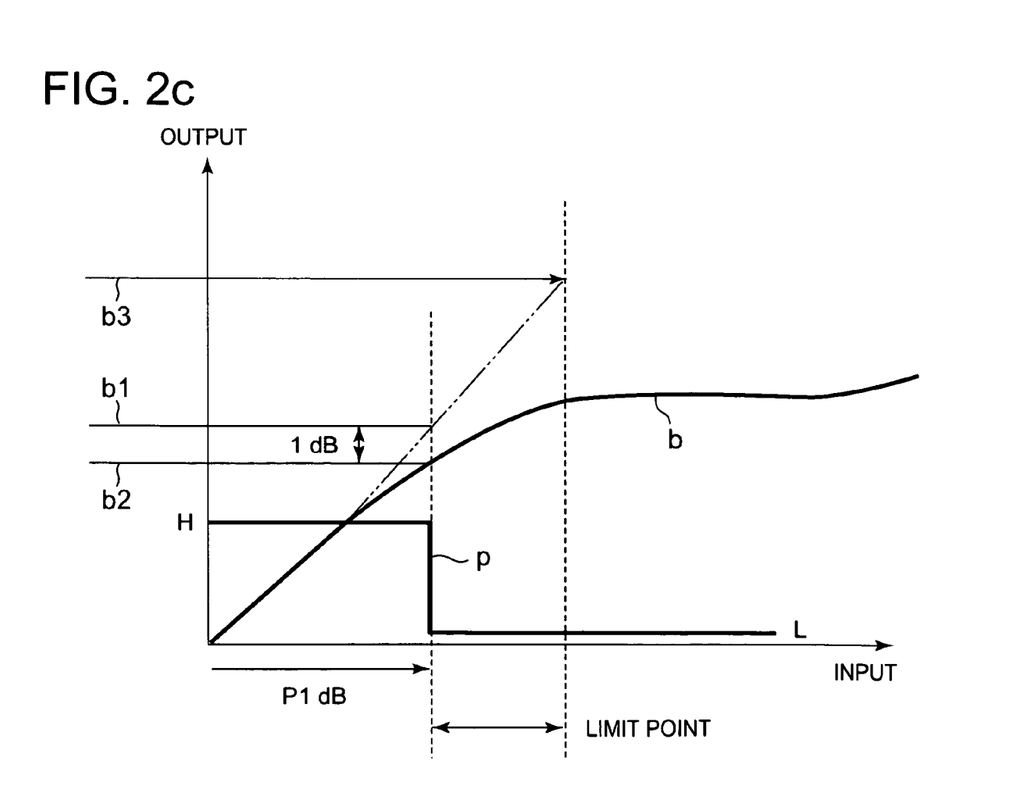

The high frequency signal (b) output from the RF-AMP 1 is also supplied to LIMIT 5. FIGS. 2a and 2b are views showing an input and/or output operation of LIMIT 5. As shown in FIG. 2a, the high frequency signal (b) is supplied to a negative terminal of the LIMIT 5 and a threshold signal (th) of P1 dB is supplied to its positive terminal as a criterion. LIMIT 5 compares these two analog signals to output LIMIT data, i.e. a binary digital signal (p). More specifically, as shown in FIG. 2b, when the high frequency signal (b) at the negative terminal is less than the threshold signal (th) of P1 dB, LIMIT 5 outputs a signal (p) of a high level H, and on the contrary, when the high frequency signal (b) at the negative terminal is not less than the threshold signal (th) of P1 dB, LIMIT 5 outputs a signal (p) of a low level L. In general, an input allowable limit of MIXER 2 is a small value defined by the value of P1 dB, as shown in FIG. 2c. In FIG. 2c, the limit of P1 dB at which distortion appears in the output of MIXER 2 is defined by an output point of b2, which is lower than an output point b1 by 1 dB while IN-OUT characteristic of MIXER 2 keeps a substantially perfect linear relationship. When an input to RF-AMP 1 is less than P1 dB, no distortion appears in the output of RF-AMP 1 and a measure of C/N also keeps high. When the input to RF-AMP 1 becomes larger than or equal to P1 dB, RF-AMP 1 starts to distort its output little by little. When the output of RF-AMP 1 becomes larger than or equal to a value of b3, a measure of C/N becomes very low and a receiving performance of the receiver is degraded greatly. Therefore, the range of LIMIT point is defined by an input to RF-AMP 1 of larger than or equal to P1 dB and its output of not larger than a value of b3.

Figure 3:
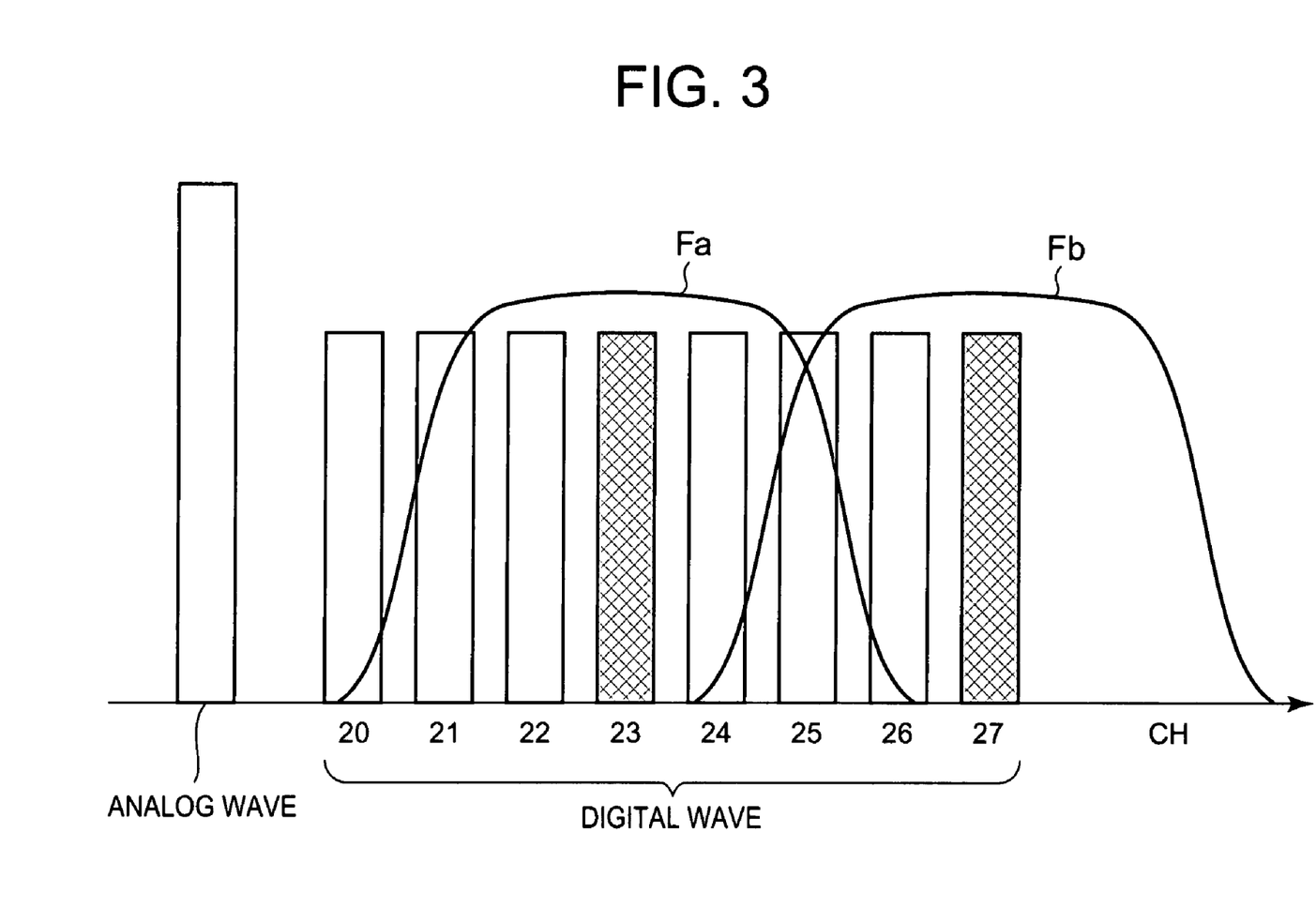
FIG. 3 is a view showing by an example filtering characteristics of two RSSI•Filters shown in FIG. 1.

In the configuration shown in FIG. 1, the low frequency signal (c) output from the analog MIXER 2 is supplied to RSSI•Filter 6 and RSSI•Filter 7, and subjected to band pass filtering processes of different frequency bands. FIG. 3 is a view showing by an example filtering characteristics of RSSI•Filter 6 and RSSI•Filter 7. As shown in FIG. 3, RSSI•Filter 6 has a wide band pass filtering characteristic Fa and RSSI•Filter 7 has a narrow band pass filtering characteristic Fb. As shown in FIG. 1, signals (g1) and (g2) subjected respectively to filtering processes in RSSI•Filter 6 and RSSI•Filter 7 are supplied to SW 8, and RSSI signal (g) output from either of RSSI•Filter 6 or RSSI•Filter 7 is selected depending on a selection signal (i) supplied from CPU 12.

Figure 4:
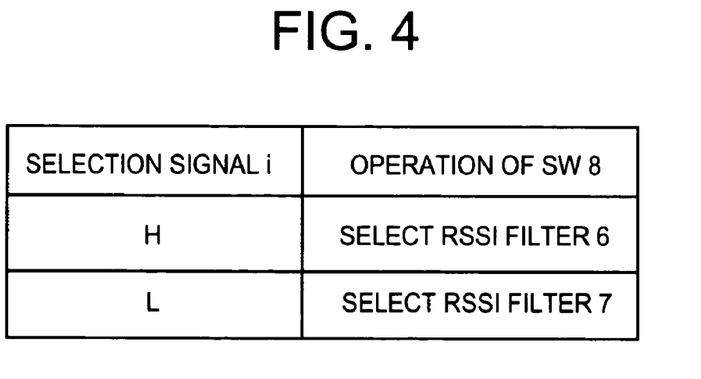
FIG. 4 is a view showing a function of a switching circuit shown in FIG. 1.

FIG. 4 is a view showing a selecting operation performed by SW 8 when the selection signal (i) of a high level H or that of a low level L is supplied to SW 8 from CPU 12. CPU 12 outputs the selection signal (i) of a high level H to select the signal (g1) from RSSI•Filter 6 having the wide band pass filtering characteristic Fa, when the receiver receives many digital waves. On the contrary, CPU 12 outputs the selection signal (i) of a low level H to select the signal (g2) from RSSI•Filter 7 having the narrow band pass filtering characteristic Fb, when the receiver receives a few digital waves. As shown in FIG. 1, the signal (g) selected by SW 8 is supplied to the subtractor 9 and SW 10. The subtractor 9 subtracts the signal (d) output by the IF-BPF 3 from the signal (g) selected by SW 8, and supplies a difference signal (h) to CPU 12. CPU 12 compares the difference signal (h) with a particular threshold value and outputs a selection signal (j) to SW 10. A signal (k) selected by SW 10 depending on the selection signal (j) is supplied to RF-AGC 11. A control operation of CPU 12 for controlling SW 8 and SW 10 will be described in detail later.

Figure 5:
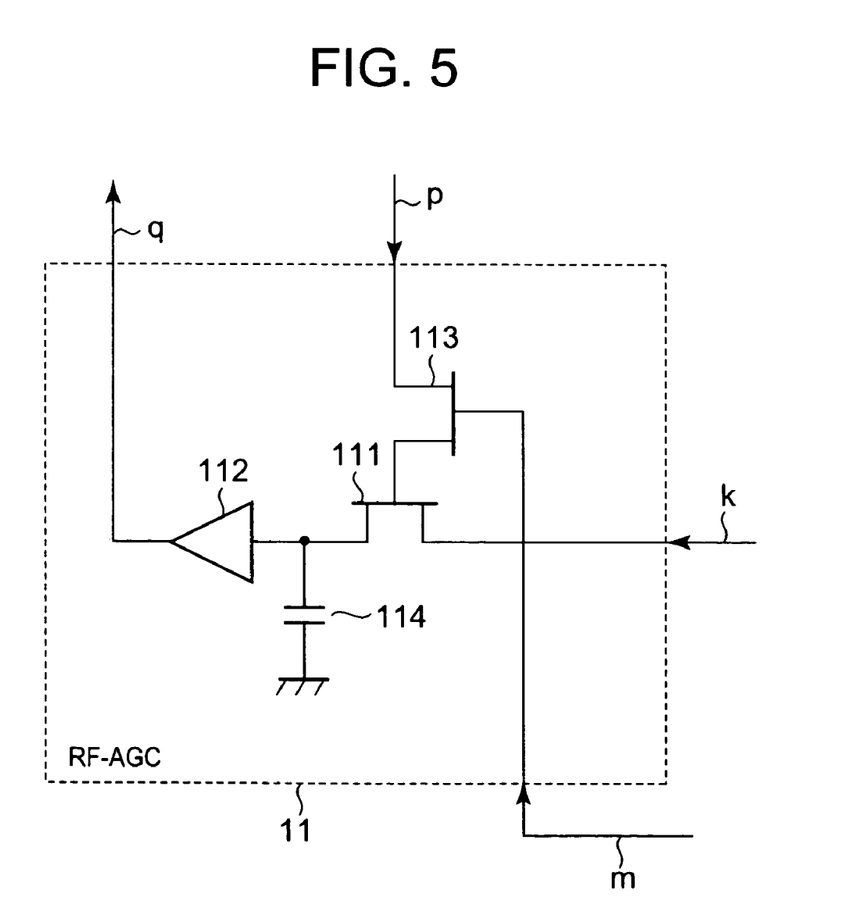
FIG. 5 is a view showing a circuit configuration of RF-AGC shown in FIG. 1.

FIG. 5 is a view showing a detailed circuit configuration of RF-AGC 11. The signal (p) and signal (m) are supplied to RF-AGC 11 respectively from LIMIT 5 and CPU 12 in addition to the above signal (k). While FET switch 111 is kept on, the signal (k) is supplied to a buffer 112 through FET switch 111, and the buffer 111 supplies AGC signal (q) to RF-AMP 1. The signal (p) is supplied to a gate electrode of FET switch 111 while FET switch 113 is kept on. Receiving the signal (p) of a high level, FET switch 111 is made on, and on the contrary, receiving the signal (p) of a low level, FET switch 111 is made off. FET switch 113 is made on upon receipt of a high level signal (m) at its gate electrode, and meanwhile FET switch 113 is made off when a low level signal (m) is supplied to its gate electrode. While FET switch 113 is kept on with the high level signal (m) supplied to its gate electrode, FET switch 111 turns from on to off when the signal (p) changes from a high level to a low level. Therefore, a capacitor 114 holds the signal (k) which is supplied from FET switch 111 just before the FET switch 111 changes from on to off. When the signal (p) supplied to the gate electrode of FET switch 111 through FET switch 113 changes from a high level to a low level, and FET switch 111 turns from on to off in response to a change in the level of the signal (p), then the buffer 112 outputs the signal (k) of a fixed level, held by the capacitor 114, as the AGC signal (q). Although not shown in FIG. 5, since the gate electrode of FET switch 111 is kept at a high level by a pull up resister connected thereto, FET switch 111 is arranged to continue its operation, even though FET switch 113 turns off.

As described above, when the output signal (b) of RF-AMP 1 is less than P1 dB, in other words, LIMIT 5 outputs the signal (p) of a high level, the signal (k) from SW 10 is supplied to RF-AMP 1 as AGC signal, and when the output signal (b) of RF-AMP P1 exceeds P1 dB, the signal (k) held by the capacitor 114 is supplied to RF-AMP 1 as AGC signal.

Now, operation of the broadcasting receiver will be described referring to the flow charts shown in FIGS. 6 and 7.

Figure 6:
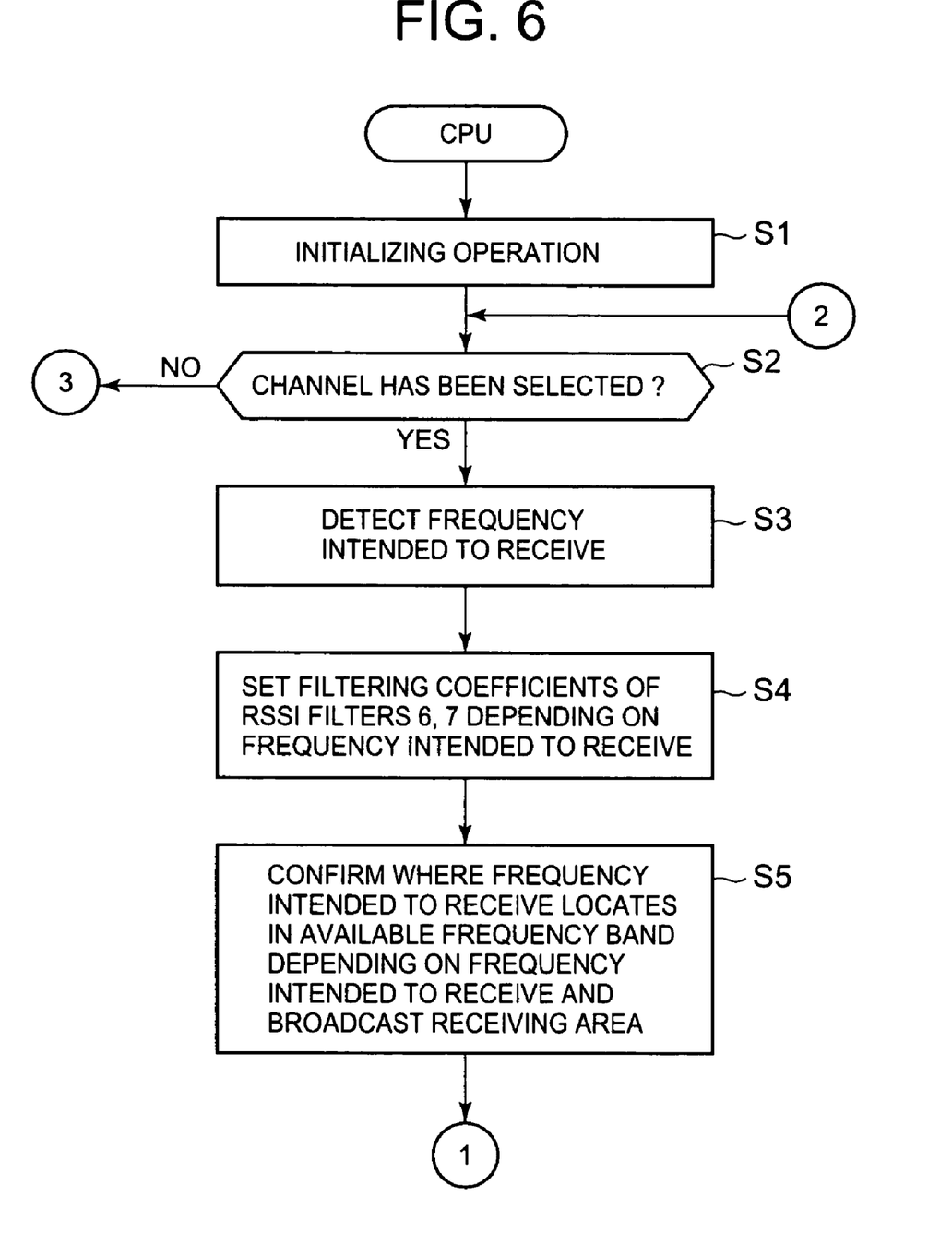
FIG. 6 is a flow chart (1) of operation performed in the broadcasting receiver.
Figure 7:
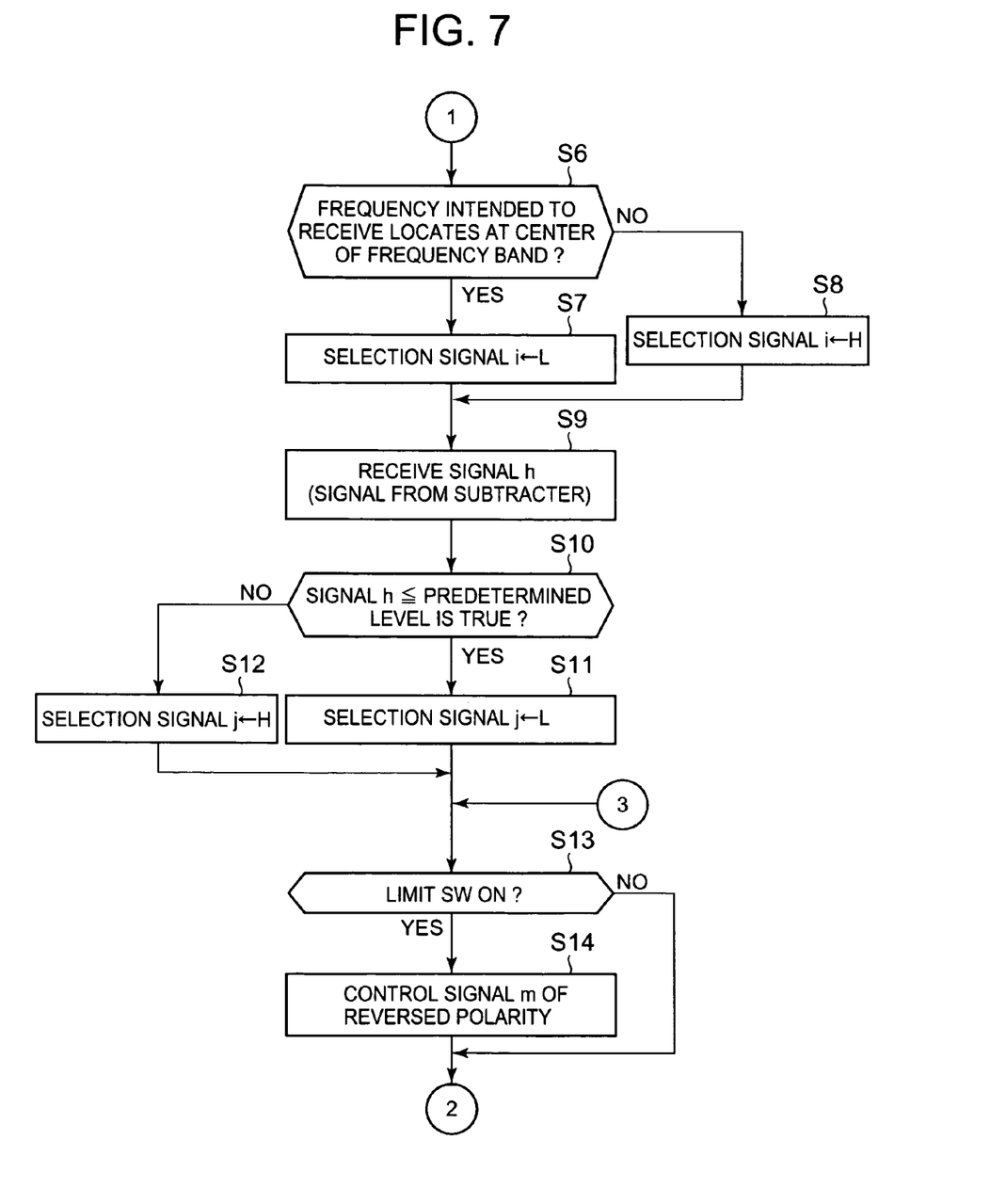
FIG. 7 is a flow chart (2) of operation performed in the broadcasting receiver.

In FIG. 6, an initializing operation is executed at step S1, and then it is judged at step S2 whether or not any broadcasting channel has been selected by operation of a remote control device and the like. When a broadcasting channel has been selected (YES at step S2), a frequency intended to receive is detected in response to selection of the broadcasting channel at step S3. The frequency intended to receive is automatically set in response to selection of the broadcasting channel. Filtering coefficients of RSSI•Filters 6 and 7 are set at step S4. More specifically, the filtering coefficients of the band pass characteristic Fa of RSSI•Filters 6 and band pass characteristic Fb of RSSI•Filters 7 are set such that the detected frequency positions at the centers of the frequency bands.

When the frequency intended to receive has been detected at step S3 and the filtering coefficients of RSSI•Filters 6 and 7 have been set at step S4, or when any broadcasting channel has not yet been selected at step S2, that is, when processes at steps S3 and S4 have already been executed, the number of available broadcasting channels in the vicinity of the selected broadcasting channel, i.e. the number of digital waves are searched based on the selected broadcasting channel and the current broadcast receiving area. In other words, it is confirmed at step S5 where the frequency intended to receive locates in a channel frequency band available at the current broadcast receiving area. It is judged at step S6 in FIG. 6, whether or not the frequency intended to receive locates at the center of the frequency band, and further judged whether or not many digital waves are available in the vicinity of the frequency intended to receive. When not many digital waves are available in the vicinity of the frequency intended to receive, i.e. when the frequency intended to receive locates near the end of the available frequency band (YES at step S6), CPU 12 outputs its output (i) of a low level L to make SW 8 select the signal (g2) supplied from RSSI•Filter 7 having a narrow frequency band at step S7. On the contrary, when many digital waves are available in the vicinity of the frequency intended to receive, i.e. when the frequency intended to receive locates at the center of the available frequency band (NO at step S6), CPU 12 outputs its output (i) of a high level H to make SW 8 select the signal (g1) supplied from RSSI•Filter 6 having a wide frequency band at step S8.

Then, CPU 12 receives the output signal (h) of the subtractor 9 at step S9, and judges at step S10 whether or not the signal (h) is less than or equal to a predetermined level. When it is determined that the signal (h) is less than or equal to a predetermined level (YES at step S10), CPU 12 outputs to SW 10 the selection signal (j) of a low level L, making SW 10 select the signal (g), i.e. either of the signal (g1) of RSSI•Filter 6 or the signal (g2) of RSSI•Filter 7 selected by SW 8. Then SW 10 supplies the selected signal (g), i.e. the signal (k) to RF-AGC 11, and RF-AGC outputs the AGC signal (q) to RF-AMP 1 at step S11. When it is determined that the signal (h) is not less than or equal to the predetermined level (NO at step S10), CPU 12 outputs the selection signal (j) of a high level H to SW 10, making SW 10 select the signal (h) from the subtractor 9. Then SW 10 supplies the selected signal (h), i.e. the signal (k) to RF-AGC 11, and RF-AGC outputs the AGC signal (q) to RF-AMP 1 at step S12.

When the selection signal (j) has been supplied to SW 10 at step S11 or S12, or when no broadcasting channel has been selected (NO at step S2), it is judged at step S13 whether or not Limit switch has been turned on by the remote control device and the like. When it is determined that Limit switch has been turned on (YES at step 13), CPU 12 supplies the control signal (m) of a reversed polarity to RF-AGC 11 at step S14. When the selection signal (m) to be supplied from CPU 12 to RF-AGC 11 (FIG. 5) is of a high level H, FET switch 113 is kept on, allowing the signal (p) to pass through from LIMIT 5 to FET switch 111. Accordingly, when the signal (p) supplied to FET switch 111 is of a high level H, FET switch 111 is kept on, allowing the signal (k) of SW 10, i.e. AGC signal (q) to pass through to RF-AMP 1. Meanwhile, the signal (p) turns from a high level H to a low level L, FET switch 111 is made off, and the signal (k) which is applied to the capacitor 114 just before FET switch 111 turns off is held by the capacitor 114, and supplied to the buffer 112. Then, the buffer 112 supplies RF-AMP 1 with AGC signal of a fixed level. When the selection signal (m) to be supplied from CPU 12 to RF-AGC 11 (FIG. 5) is of a low level L, FET switch 113 is kept off, and therefore the signal (p) of LIMIT 5 is not supplied to FET switch 111. In this case, FET switch 111 is kept on with a voltage of the pull up resister applied to its gate electrode, and signal (k) from SW 10 is supplied as AGC signal to RF-AMP 1 at all times.

When the control signal (m) has turned its polarity at step S14, or when it is determined that Limit switch has not been turned on (NO at step 13), the operation returns to step S2 in FIG. 6.

As described above, the broadcasting receiver according to the embodiment of the invention comprises: the radio-frequency amplifying circuit 1 for amplifying a received broadcasting radio-frequency signal, mixer circuit 2 for mixing the radio-frequency signal amplified by the radio-frequency amplifying circuit 1 with a variable oscillation signal from the local oscillator responding the channel selection signal, whereby a low frequency signal is generated, an automatic gain control circuit 11 for generating AGC signal having an amplitude corresponding to the electrical intensity of the low frequency signal output from the mixer circuit 2 and for supplying AGC signal to radio-frequency amplifying circuit 1, and the limiter circuit 5. The limiter circuit 5 watches the amplitude of the radio-frequency signal to be supplied to the mixer circuit 2, and when the amplitude of the radio-frequency signal exceeds the predetermined value, the limiter circuit 5 supplies AGC signal which is held just before the amplitude of the radio-frequency signal exceeds the predetermined value to RF-AGC 11, whereby the gain of RF-AMP 1 is controlled.

As described above, the broadcasting receiver according to the embodiment of the present invention is made compact in size and light in weight, and is capable of effectively reducing signal levels of interference broadcasting waves and preventing drop in the signal level of the broadcasting wave to be intended to receive without increasing power consumption and manufacturing cost.

In the above embodiment, the upper limit of the radio-frequency signal which does not distort the low frequency signal output from the mixer circuit 2 is set as the predetermined value for the limiter circuit 5.

Meanwhile, the predetermined value for the limiter circuit 5 is set to an amplitude which is lower by 1 dB than an amplitude of a radio frequency at which the relationship between the high frequency signal to be input to the mixer circuit 2 and the low frequency signal output from the mixer circuit 2 changes from a linear relationship to a non linear relationship". Therefore, images and sounds of high quality can be reproduced without distortion.

What is claimed is:

1. A broadcasting receiver comprising:
   a radio-frequency signal receiving unit for receiving a broadcasting radio-frequency signal;
   an amplifying unit having a feed back terminal, for amplifying the radio-frequency signal received by the radio-frequency signal receiving unit at a gain corresponding to a feed back signal entered to the feed back terminal;
   a mixing unit for mixing the radio-frequency signal amplified by the amplifying unit with a variable oscillation signal corresponding to a channel selection signal for selecting a frequency band to be received whereby the mixing unit generates a low frequency signal;
   a signal generating unit for generating a first signal having an amplitude corresponding to the low frequency signal generated by the mixing unit;
   a signal processing unit for executing a filtering process on the low frequency signal generated by the mixing unit to allow only signal components of the low frequency signal which fall within a filtering frequency band to pass through, the filtering frequency band being determined by a relationship between a frequency band to which the low frequency signal belongs and a frequency band assigned to a broadcast receiving area where the broadcasting receiver receives the broadcasting radio-frequency signal;
   a subtracting unit for calculate a difference between the first signal generated by the signal generating unit and the signal subjected to the filtering process by the signal processing unit and for generating a second signal corresponding to the calculated difference; and
   a first signal selection unit for feeding back the second signal as a negative feed back signal to the feed back terminal of the amplifying unit, when an amplitude of the second signal generated by the subtracting unit is larger than a predetermined value, and feeding back the first signal as a negative feed back signal to the feed back terminal of the amplifying unit, when the amplitude of the second signal generated by the subtracting unit is not larger than the predetermined value.

2. The broadcasting receiver according to claim 1, wherein the signal processing unit comprises:
   plural filtering units each for allowing only the low frequency signal falling within a frequency band to pass through, the frequency band being defined by dividing the frequency band assigned to the broadcast receiving area; and
   a second signal selection unit for selecting a signal from among the signals passing through the plural filtering units based on which of the frequency bands the first signal generated by the signal generating unit belongs to, and
   the subtracting unit calculates a difference between the first signal generated by the signal generating unit and the signal selected by the second signal selection unit and generates a second signal corresponding to the calculated difference.

3. The broadcasting receiver according to claim 2, wherein the plural filtering units comprises:
   a first filtering unit for allowing only a signal to pass through that falls within a frequency band including an end of the frequency band assigned to the broadcast receiving area; and
   a second filtering unit for allowing only such a signal to pass through that falls within a frequency band other than the frequency band including the end of the frequency band assigned to the broadcast receiving area.

4. A method of receiving a broadcasting wave, used in a broadcasting receiver which is provided with an amplifying unit having a feed back terminal, for amplifying a received radio-frequency signal at a gain corresponding to a feed back signal entered to the feed back terminal, the method comprising the steps of:
   step A: mixing the radio-frequency signal amplified by the amplifying unit with a variable oscillation signal corresponding to a channel selection signal for selecting a frequency band to be received whereby a low frequency signal is generated;
   step B: generating a first signal having an amplitude corresponding to the low frequency signal generated in step A;
   step C: executing a filtering process on the low frequency signal generated in step B to allow only signal components of the low frequency signal which fall within a filtering frequency band to pass through, the filtering frequency band being determined by a relationship between a frequency band to which the low frequency signal belongs and a frequency band assigned to a broadcast receiving area where the broadcasting receiver receives the broadcasting radio-frequency signal;

step D: calculating a difference between the first signal generated in step B and the signal subjected to the filtering process in step C and generating a second signal corresponding to the calculated difference; and step E: feeding back the second signal generated in step D as a negative feed back signal to the feed back terminal of the amplifying unit, when an amplitude of the second signal is larger than a predetermined value, and feeding back the first signal generated in step B as a negative feed back signal to the feed back terminal of the amplifying unit, when the amplitude of the second signal generated in step D is not larger than the predetermined value.

5. The method of receiving a broadcasting wave according to claim 4, wherein the broadcasting receiver comprises:

plural filtering units each for allowing only the low frequency signal falling within a frequency band to pass through, the frequency band being defined by dividing the frequency band assigned to the broadcast receiving area; and in step C, a signal is selected from among the signals passing through the plural filtering units based on which of the frequency bands the first signal belongs to, and in step D, a difference between the first signal generated in step B and the signal selected in step C is calculated and a second signal corresponding to the calculated difference is generated.

6. A broadcasting receiver comprising:

a receiving unit for receiving a broadcasting radio-frequency signal;

an amplifying unit having a feed back terminal, for amplifying the radio-frequency signal received by the receiving unit at a gain corresponding to a feed back signal entered to the feed back terminal;

a mixing unit for mixing the radio-frequency signal amplified by the amplifying unit with a variable oscillation signal corresponding to a channel selection signal for selecting a frequency band to be received whereby the mixing unit generates a low frequency signal;

a feed back unit for generating a negative feed back signal having an amplitude corresponding to the low frequency signal generated by the mixing unit, and for supplying the negative feed back signal to the feed back terminal of the amplifying unit; and a control unit for holding an amplitude of the feed back signal generated just before an amplitude of the radio-frequency signal input to the mixing unit exceeds a predetermined value, when the amplitude of the radio-frequency signal exceeds the predetermined value, and for controlling the feed back unit to supply the feed back signal having the held amplitude to the feed back terminal of the amplifying unit.

7. The broadcasting receiver according to claim 6, wherein the predetermined value used by the control unit is set to an amplitude of the radio frequency signal supplied to mixing circuit just before the low frequency signal generated by the mixing circuit starts becoming distorted.

8. The broadcasting receiver according to claim 6, wherein the predetermined value used by the control unit is set to a value which is smaller by a predetermined value than an amplitude of the radio-frequency signal at which a relationship between the radio-frequency signal input to the mixing unit and the low frequency signal output from the mixing unit changes from a linear relationship to a non-linear relationship.

9. A method of receiving a broadcasting wave, used in a broadcasting receiver which is provided with an amplifying unit having a feed back terminal, for amplifying a received radio-frequency signal at a gain corresponding to a feed back signal entered to the feed back terminal, the method comprising the steps of:

step A: mixing the radio-frequency signal amplified by the amplifying unit with a variable oscillation signal corresponding to a channel selection signal for selecting a frequency band to be received whereby a low frequency signal is generated;

step B: generating a negative feed back signal having an amplitude corresponding to the low frequency signal generated in step A, and supplying the negative feed back signal to the feed back terminal of the amplifying unit; and step C: holding an amplitude of the negative feed back signal generated just before an amplitude of the radio-frequency signal to be mixed in step B exceeds a predetermined value, when the amplitude of the radio-frequency signal exceeds the predetermined value, and for supplying the negative feed back signal having the held amplitude to the feed back terminal of the amplifying unit.

10. The method of receiving a broadcasting wave according to claim 9, wherein the predetermined value used in step C is set to an amplitude of the radio-frequency signal is mixed just before the low frequency signal generated in step A starts becoming distorted.

11. The method of receiving a broadcasting wave according to claim 9, wherein the predetermined value used in step C is set to a value which is smaller by a predetermined value than an amplitude of the radio frequency signal at which a relationship between the radio-frequency signal before subjected to the process in step A and the low frequency signal after subjected to the process in step A changes from a linear relationship to a non-linear relationship.

* * * * *